United States Patent
Kim et al.

(10) Patent No.: US 8,742,780 B2
(45) Date of Patent: Jun. 3, 2014

(54) SEMICONDUCTOR DEVICES INCLUDING DESIGN FOR TEST CAPABILITIES AND SEMICONDUCTOR MODULES AND TEST SYSTEMS INCLUDING SUCH DEVICES

(75) Inventors: Seok-Il Kim, Seoul (KR); Ho-Suk Lee, Hwaseong-si (KR); You-Keun Han, Yongin-si (KR); Yang-Ki Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 810 days.

(21) Appl. No.: 12/915,314

(22) Filed: Oct. 29, 2010

(65) Prior Publication Data

US 2011/0115509 A1    May 19, 2011

(30) Foreign Application Priority Data

Nov. 18, 2009    (KR) .................. 10-2009-0111225

(51) Int. Cl.
| | |
|---|---|
| *G01R 31/3187* | (2006.01) |
| *G01R 31/317* | (2006.01) |
| *G01R 31/3185* | (2006.01) |
| *G01R 31/28* | (2006.01) |
| *G01R 31/30* | (2006.01) |
| *H01L 21/66* | (2006.01) |

(52) U.S. Cl.
CPC ...... *G01R 31/31717* (2013.01); *G01R 31/3185* (2013.01); *G01R 31/2884* (2013.01); *G01R 31/3004* (2013.01); *H01L 22/34* (2013.01)
USPC ........................................... 324/750.3

(58) Field of Classification Search
CPC .................. G01R 31/31717; G01R 31/3185
See application file for complete search history.

(56) References Cited

U.S. PATENT DOCUMENTS

| 8,386,737 B2 * | 2/2013 | Jeon et al. ............ 711/167 |
| 2011/0047319 A1 * | 2/2011 | Jeon et al. ............ 711/103 |

FOREIGN PATENT DOCUMENTS

| JP | 2008-166934 | 7/2008 |
| KR | 10-20070028064 A | 3/2007 |
| KR | 10-20070035331 A | 3/2007 |

OTHER PUBLICATIONS

English translation of JP2008-166934 filed on Jul. 17, 2008.*

* cited by examiner

*Primary Examiner* — Jermele M Hollington
(74) *Attorney, Agent, or Firm* — Myers Bigel Sibley & Sajovec, PA (57) ABSTRACT

A semiconductor device includes a resistor terminal, a reference voltage generator and a detector. The resistor terminal is connected to an external resistor. The reference voltage generator generates at least one reference voltage. The detector generates a detection signal based at least in part on a resistor terminal voltage and the at least one reference voltage. The detection signal indicates a state of an electrical connection to the resistor terminal. The resistor terminal voltage is a voltage at the resistor terminal.

6 Claims, 10 Drawing Sheets

|  | CS1 | CS2 | DS | TEST RESULT |
|---|---|---|---|---|
| CASE1 | L | L | L | PASS |
| CASE2 | L | H | H | FAIL |
| CASE3 | H | L | H | FAIL |
| CASE4 | H | L | H | FAIL |

SEMICONDUCTOR DEVICES INCLUDING DESIGN FOR TEST CAPABILITIES AND SEMICONDUCTOR MODULES AND TEST SYSTEMS INCLUDING SUCH DEVICES

CROSS-REFERENCE TO RELATED APPLICATION

This application claims priority under 35 USC §119 to Korean Patent Application No. 2009-0111225, filed on Nov. 18, 2009 in the Korean Intellectual Property Office (KIPO), the contents of which are incorporated herein by reference in their entirety.

BACKGROUND

Example embodiments relate to semiconductor devices, and more particularly to semiconductor devices adopting design-for-test (DFT) schemes, and semiconductor modules and test systems including such semiconductor devices.

Semiconductor devices generally include input/output (I/O) terminals to transmit and receive signals through transmission lines that are coupled to an external device. An impedance of the I/O terminal should be sufficiently matched to an impedance of the transmission line in order to reduce and/or prevent signal reflections at the interface between the semiconductor device and the transmission line. However, as the operating speed of semiconductor devices has increased, it has become more difficult to match the impedance of an I/O terminal to the impedance of an associated transmission line, and the signals transmitted over the transmission lines may be distorted due to such impedance mismatching.

Various impedance matching methods have been developed to match the impedance of an I/O terminal to the impedance of an associated transmission line. For example, some semiconductor memory devices such as the Double Data Rate 3 (DDR3) Synchronous Dynamic Random Access Memory (SDRAM) devices perform the impedance matching by using a ZQ calibration unit and a ZQ terminal included in the semiconductor memory device and an external ZQ resistor connected between the ZQ terminal and a ground voltage.

SUMMARY

Some example embodiments provide a semiconductor device that is configured to test an external electrical connection between a resistor terminal and an external resistor.

Some example embodiments provide a semiconductor module and/or a test system including the semiconductor device.

According to some example embodiments, a semiconductor device includes a resistor terminal, a reference voltage generator and a detector. The resistor terminal is connected to an external resistor. The reference voltage generator generates at least one reference voltage. The detector generates a detection signal based at least in part on a voltage of the resistor terminal (the "resistor terminal voltage") and the at least one reference voltage. The detection signal may indicate a state of an electrical connection to the resistor terminal.

The electrical connection may be an external electrical connection between the resistor terminal and the external resistor. The detection signal may indicate whether the state of the external electrical connection between the resistor terminal and the external resistor is normal or abnormal. and The at least one reference voltage may be based on a power supply voltage.

The semiconductor device may further include at least one input/output (I/O) terminal connected to the detector. The semiconductor device may output the detection signal through the at least one I/O terminal. The at least one I/O terminal may be a data I/O terminal in some embodiments.

In some embodiments, the at least one reference voltage may include a first reference voltage. The detector may include a comparator. The comparator may compare the resistor terminal voltage and the first reference voltage to generate the detection signal.

The detection signal may have a first logic level when the external electrical connection is normal, and the detection signal may have a second logic level when the external electrical connection is abnormal.

The first reference voltage may have a level between a normal level and an abnormal level. The normal level may be a level of the resistor terminal voltage when the external electrical connection is normal, and the abnormal level may be the level of the resistor terminal voltage when the external electrical connection is abnormal.

In other embodiments, the semiconductor device may further include an impedance calibration unit that is connected to the resistor terminal. The impedance calibration unit may calibrate an input impedance and/or an output impedance for the semiconductor device in response to an impedance calibration signal. The semiconductor device may be configured to simultaneously output the detection signal and calibrate the input impedance and/or output impedance for the semiconductor device.

The detection signal may further indicate whether an internal electrical connection between the resistor terminal and the impedance calibration unit is not mai or abnormal.

In some embodiments, the detector may include a first comparator, a second comparator and an OR gate. The first comparator may compare the resistor terminal voltage with a first reference voltage of the at least one reference voltage to generate a first comparison signal. The second comparator may compare the resistor terminal voltage with a second reference voltage of the at least one reference voltage to generate a second comparison signal. A level of the second reference voltage may be lower than a level of the first reference voltage. The OR gate may perform an OR operation on the first comparison signal and the second comparison signal to generate the detection signal.

The first reference voltage may be a voltage that is between a level of the resistor terminal voltage when both the external electrical connection and the internal electrical connection are normal and a level of the resistor terminal voltage when the external electrical connection is abnormal. The second reference voltage may be a voltage that is between the level of the resistor terminal voltage when both the external electrical connection and the internal electrical connection are normal and the level of the resistor terminal voltage when the internal electrical connection is abnormal.

The detection signal may have a first logic level when both of the external electrical connection and the internal electrical connection are normal, and the detection signal may have a second logic level when at least one of the external electrical connection and the internal electrical connection is abnormal.

The first reference voltage may have the level between a normal level and a first abnormal level, and the second reference voltage may have the level between the normal level and a second abnormal level. The normal level may be a level of the resistor terminal voltage when both of the external electrical connection and the internal electrical connection are normal, the first abnormal level may be the level of the resistor terminal voltage when the external electrical connection is abnormal, and the second abnormal level may be the level of the resistor terminal voltage when the internal electrical connection is abnormal.

The semiconductor device may output the detection signal in response to the impedance calibration signal.

The semiconductor device may further include a test mode controller. The test mode controller may generate a test mode register set (MRS) signal based on a command signal and an address signal. The reference voltage generator may generate the at least one reference voltage and the detector generates the detection signal when the test MRS signal is enabled.

According to other example embodiments, a test system includes a semiconductor module. The semiconductor module includes a module board, a plurality of resistors on the module board and a plurality of semiconductor devices on the module board. Each of the plurality of semiconductor devices includes a resistor terminal, a reference voltage generator and a detector. The resistor terminal is connected to a respective one of the plurality of resistors. The reference voltage generator generates at least one reference voltage. The detector generates a detection signal based at least in part on a resistor terminal voltage and the at least one reference voltage. The detection signal indicates a state of an electrical connection to the resistor terminal.

The electrical connection may be an external electrical connection between the resistor terminal and the respective one of the plurality of resistors. The detection signal may indicate whether the state of the external electrical connection between the resistor terminal and the respective one of the plurality of resistors is normal or abnormal. Each of the plurality of semiconductor devices may further include an impedance calibration unit connected to the resistor terminal. The impedance calibration unit may calibrate an input impedance and/or an output impedance for a respective one of the plurality of semiconductor devices. The detection signal may further indicate whether an internal electrical connection between the resistor terminal and the impedance calibration unit is normal or abnormal.

The test system may further include a test device. The test device may test the semiconductor module to determine whether electrical connections between the plurality of semiconductor devices and the plurality of resistors are normal or abnormal.

The test device may include a test controller that generates a command signal and an address signal controlling the semiconductor module.

Each of the plurality of semiconductor devices may further include a test mode controller. The test mode controller may generate a test mode register set (MRS) signal based on the command signal and the address signal. The reference voltage generator may generate the at least one reference voltage, and the detector may generate the detection signal when the test MRS signal is enabled.

Each of the plurality of semiconductor devices may further include at least one input/output (I/O) terminal connected to the detector. Each of the plurality of semiconductor devices may output the detection signal through the at least one I/O terminal.

According to other example embodiments, a semiconductor device includes a semiconductor integrated circuit and an external resistor. The semiconductor integrated circuit includes a resistor terminal, an impedance calibration unit, a reference voltage generator and a detector. The impedance calibration unit is connected to the resistor terminal and is configured to calibrate an input impedance and/or an output impedance for the semiconductor device in response to an impedance calibration signal. The reference voltage generator is configured to generate at least one reference voltage. The detector is configured to generate a detection signal based at least in part on a voltage of the resistor terminal and the at least one reference voltage, the detection signal indicates a state of at least one of an external electrical connection between the resistor terminal and the external resistor and an internal electrical connection between the resistor terminal and the impedance calibration unit. The external resistor is connected to the resistor terminal.

The detection signal may indicate whether the state of at least one of the external electrical connection and the internal electrical connection is normal or abnormal.

The semiconductor device may further include at least one input/output (I/O) terminal connected to the detector. the semiconductor device may be configured to substantially simultaneously output the detection signal through the at least one I/O terminal and perform an impedance calibrating operation.

The at least one reference voltage may include a first reference voltage and a second reference voltage that is lower than the first reference voltage, the detector may include a first comparator and a second comparator. The first comparator may be configured to compare the voltage of the resistor terminal and the first reference voltage to generate a first comparison signal. The second comparator may be configured to compare the voltage of the resistor terminal voltage and the second reference voltage to generate a second comparison signal.

Accordingly, in the semiconductor device according to some example embodiments, the detector generates the detection signal, which indicates whether an electrical connection between the resistor terminal and the external resistor is normal or abnormal, and the detection signal is output through the I/O terminal. In addition, the semiconductor device simultaneously performs the impedance calibrating operation and the outputting the detection signal in response to the impedance calibration signal. Thus, the electrical connection in the semiconductor device may be effectively tested.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc., may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
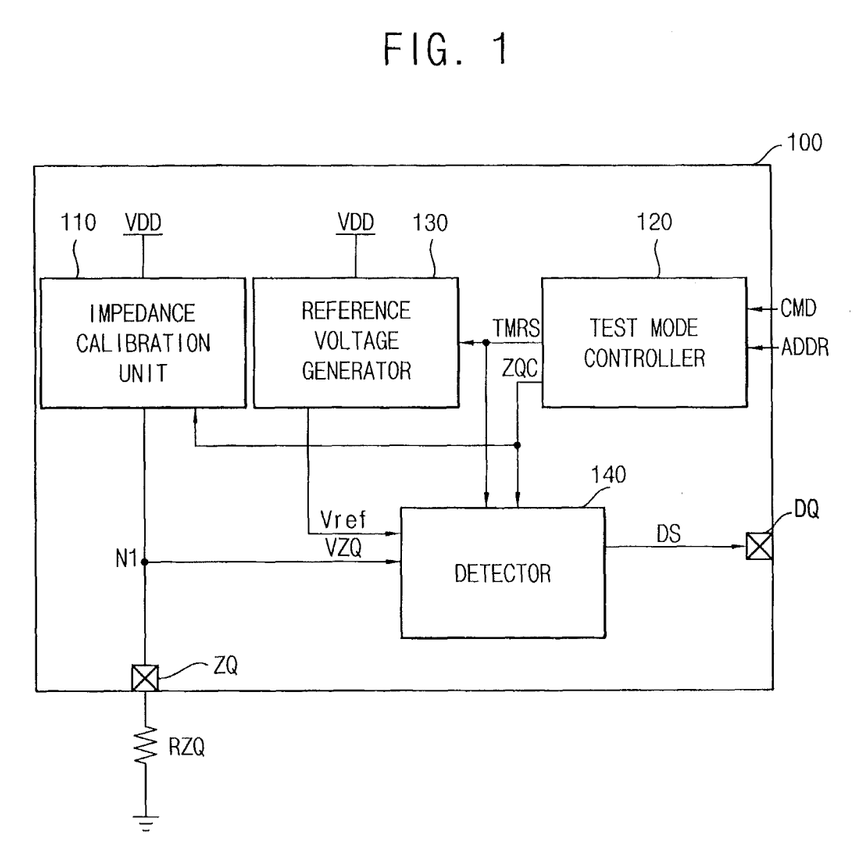
FIG. 1 is a block diagram illustrating a semiconductor device according to some example embodiments.

FIG. 1 is a block diagram illustrating a semiconductor device 100 according to some example embodiments.

Referring to FIG. 1, the semiconductor device 100 includes a resistor terminal ZQ, a reference voltage generator 130 and a detector 140. The semiconductor device 100 may further include an input/output (I/O) terminal DQ, an impedance calibration unit 110 and a test mode controller 120. The semiconductor device 100 may be a semiconductor memory device in some embodiments.

The resistor terminal ZQ may be disposed in the semiconductor device 100 and may be connected to an external resistor RZQ. A voltage at the resistor terminal ZQ may be adjusted or calibrated based on a voltage signal from the impedance calibration unit 110, and the voltage at the resistor terminal ZQ may be referred to as a resistor terminal voltage VZQ. The resistor terminal voltage VZQ may have significantly different levels depending on whether the semiconductor device 100 is defective or non-defective. The levels of the resistor terminal voltage VZQ will be described later with reference to FIGS. 2 and 3.

The reference voltage generator 130 generates at least one reference voltage Vref based on a power supply voltage VDD. The reference voltage generator 130 may include a plurality of active resistors connected in series and/or in parallel. The reference voltage generator 130 may adjust a level of the at least one reference voltage Vref by controlling the number of turn-on active resistors. In an example embodiment, the reference voltage generator 130 may be implemented with a plurality of voltage generators. In another example embodiment, the reference voltage generator 130 may be implemented with a voltage generator and a voltage selector.

The detector 140 generates a detection signal DS based on the resistor terminal voltage VZQ and the at least one reference voltage Vref. The detector 140 may receive the resistor terminal voltage VZQ from the resistor terminal ZQ or a first node N1. The detector 140 may output the detection signal DS in response to an impedance calibration signal ZQC that is input to the detector 140 from the test mode controller 120, as described below.

In an example embodiment, the detection signal DS indicates a state of an electrical connection to the resistor terminal ZQ. For example, the electrical connection is an external electrical connection between the resistor terminal ZQ and the external resistor RZQ, and the detection signal DS indicates that the external electrical connection is normal or abnormal. Hereinafter, this external electrical connection may be referred to as a first electrical connection. When the first electrical connection is normal (that is, the resistor terminal ZQ is electrically connected to the external resistor RZQ), the detection signal DS may have a first logic level. When the first electrical connection is abnormal (that is, the resistor terminal ZQ is electrically disconnected from the external resistor RZQ), the detection signal DS may have a second logic level. The first logic level may be a logic low level and the second logic level may be a logic high level.

The impedance calibration unit 110 is connected to the resistor terminal ZQ, and calibrates an input impedance and/or an output impedance for the semiconductor device 100 in response to the impedance calibration signal ZQC. For example, the impedance calibration unit 110 may perform the impedance calibrating operation when the impedance calibration signal ZQC is enabled. In an example embodiment, the impedance calibration unit 110 may be implemented with an Off Chip Driver (OCD) circuit for calibrating an impedance of an output driver (not shown). In another example embodiment, the impedance calibration unit 110 may be implemented with an On-Die Termination (ODT) circuit for calibrating an impedance of a termination resistor (not shown). The impedance calibration unit 110 may include both an OCD circuit and an ODT circuit. For example, in some embodiments the impedance calibration unit 110 may include a plurality of pull-up transistors, a plurality of pull-down transistors, a plurality of resistors and a voltage comparator.

In an example embodiment, the detection signal DS further indicates whether an internal electrical connection between the resistor terminal ZQ and the impedance calibration unit 110 is normal or abnormal. Hereinafter, this internal electrical connection may be referred to as a second electrical connection. When both of the first electrical connection and the second electrical connection are normal (that is, the resistor terminal ZQ is electrically connected to the external resistor RZQ and the impedance calibration unit 110), the detection signal DS may have the first logic level. When at least one of the first electrical connection and the second electrical connection is abnormal (that is, the resistor terminal ZQ is electrically disconnected to the external resistor RZQ and/or the impedance calibration unit 110), the detection signal DS may have the second logic level.

The I/O terminal DQ may be connected to the detector 140. The semiconductor device 100 may output the detection signal DS through the I/O terminal DQ for testing the first electrical connection and/or the second electrical connection. The detection signal DS may be output when the impedance calibration signal ZQC is enabled. In addition, the semiconductor device 100 may receive an input signal through the I/O terminal DQ from an external device (not shown) such as another semiconductor device or a semiconductor controller, and may provide an output signal through the I/O terminal DQ to the external device. In an example embodiment, the I/O terminal DQ is a data I/O terminal. The I/O terminal DQ may be used to test the semiconductor device 100 and to transmit data signals.

Although one I/O terminal DQ is illustrated in FIG. 1 for convenience of illustration, the semiconductor device 100 may include a plurality of I/O terminals and may output the detection signal DS through any, some, or all of the plurality of I/O terminals for the test. The external resistor RZQ is connected between the resistor terminal ZQ and a ground voltage. The impedance calibration unit 110 and the external resistor RZQ may be used to calibrate the input and output impedances for the semiconductor device 100. For example, if the impedance calibration unit 110 is implemented using an OCD circuit, the semiconductor device 100 may use the impedance calibration unit 110 and the external resistor RZQ to calibrate the impedance of the output driver.

The test mode controller 120 generates a test mode register set (MRS) signal TMRS based on a command signal CMD and an address signal ADDR. In an example embodiment, the test mode controller 120 may include a command decoder and a MRS register. The semiconductor device 100 may receive the command signal CMD and the address signal ADDR from an external device (not shown) such as the semiconductor controller. The command signal CMD may include a chip select signal CS, a row address strobe signal RAS, a column address strobe signal CAS and a write enable signal WE. The address signal ADDR may include a plurality of bits A0-A11 and BA0-BA2. The test MRS signal TMRS may be enabled when the command signal CMD and the address signal ADDR have a predetermined combination.

In an example embodiment, when the test MRS signal TMRS is enabled, the reference voltage generator 130 may generate the at least one reference voltage Vref and the detector 140 may generate the detection signal DS. For example, when the command signal CMD and the address signal ADDR have the predetermined combination, the reference voltage generator 130 and the detector 140 may be enabled and the semiconductor device 100 may test the first electrical connection and/or the second electrical connection.

The test mode controller 120 may generate the impedance calibration signal ZQC based on the command signal CMD and the address signal ADDR. In an example embodiment, when the impedance calibration signal ZQC is enabled, the impedance calibration unit 110 may perform the impedance calibrating operation and the semiconductor device 100 may output the detection signal DS through the I/O terminal DQ.

In a conventional system for testing a semiconductor device, the semiconductor device communicates with a test device through an I/O terminal. However, in the conventional semiconductor device, since an external resistor for impedance calibration is not connected to the I/O terminal, it is difficult to test an electrical connection between the resistor terminal and the external resistor by using the conventional test device.

In the semiconductor device 100 according to some example embodiments, the detector 140 generates the detection signal DS which indicates whether the external electrical connection and/or the internal electrical connection are normal or abnormal. The semiconductor device 100 outputs the detection signal DS through the I/O terminal DQ. In addition, the semiconductor device 100 may simultaneously perform the impedance calibrating operation and output the detection signal DS in response to the impedance calibration signal ZQC. Thus, the external electrical connection and/or the internal electrical connection in the semiconductor device 100 may be effectively tested.

Figure 2:
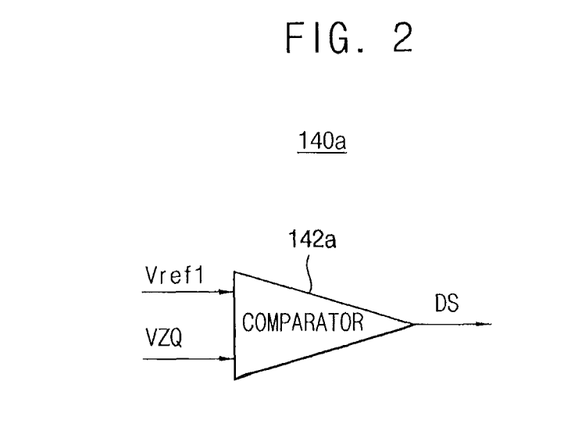
FIG. 2 is a block diagram illustrating an example of a detector that may be used in the semiconductor device of FIG. 1.

FIG. 2 is a block diagram illustrating an example embodiment of the detector 140 included in the semiconductor device of FIG. 1 (the example embodiment illustrated in FIG. 2 is designated using reference numeral 140a). In the example embodiment illustrated in FIG. 2, the at least one reference voltage Vref includes one reference voltage, that is a first reference voltage Vref1.

Referring to FIG. 2, the detector 140a may include a comparator 142a. The comparator 142a may compare the resistor terminal voltage VZQ and the first reference voltage Vref1 to generate the detection signal DS. The detection signal DS may have a first logic level when the level of the resistor terminal voltage VZQ is lower than a level of the first reference voltage Vref1, and may have a second logic level when the level of the resistor terminal voltage VZQ is higher than the level of the first reference voltage Vref1. In some embodiments, the first logic level may be a logic low level and the second logic level may be a logic high level.

In an example embodiment, when the first electrical connection is normal, the resistor terminal voltage VZQ may have a normal level. For example, when the resistor terminal ZQ is electrically connected to the external resistor RZQ, the resistor terminal ZQ may receive the resistor terminal voltage VZQ having the normal level from the impedance calibration unit 110. The normal level may correspond to about a half of the power supply voltage level VDD (i.e., 0.5×VDD). When the first electrical connection is abnormal, the resistor terminal voltage VZQ may have an abnormal level. For example, when the resistor terminal ZQ is electrically disconnected from the external resistor RZQ, the resistor terminal ZQ may receive the resistor terminal voltage VZQ having the abnormal level from the impedance calibration unit 110. The abnormal level may correspond to about the power supply voltage level VDD. The first reference voltage Vref1 may have a level between the normal level and the abnormal level. For example, when the normal level corresponds to about 0.5× VDD and the abnormal level corresponds to about VDD, the first reference voltage Vref1 may have a level of about 0.7× VDD.

Thus, when the first electrical connection is normal, the level of the resistor terminal voltage VZQ may be lower than the level of the first reference voltage Vref1 and the detection signal DS may have the first logic level (i.e., logic low level). When the first electrical connection is abnormal, the level of the resistor terminal voltage VZQ may be higher than the level of the first reference voltage Vref1 and the detection signal DS may have the second logic level (i.e., logic high level).

In an example embodiment, the detector 140a may generate the detection signal DS when the test MRS signal TMRS generated from the test mode controller 120 of FIG. 1 is enabled. For example, the detector 140a may include a switch (not shown) such as a metal oxide semiconductor (MOS) transistor which operates in response to the test MRS signal TMRS.

The detector 140a of FIG. 2 may generate the detection signal DS which indicates whether the external electrical connection is normal or abnormal. The semiconductor device 100 including the detector 140a of FIG. 2 outputs the detection signal DS through the I/O terminal DQ (see FIG. 1). Thus, the external electrical connection to the semiconductor device 100 may be effectively tested.

Figure 3:
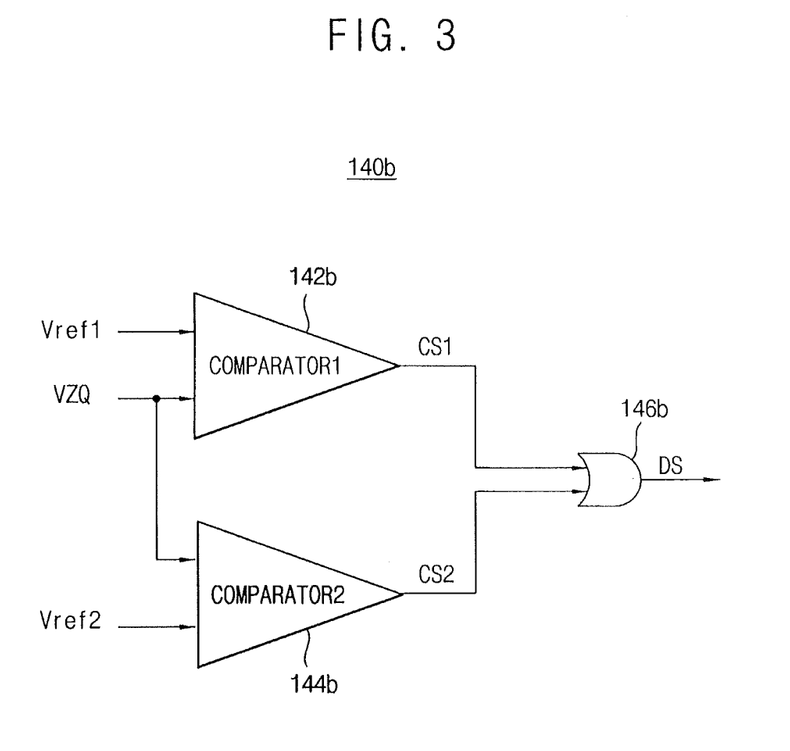
FIG. 3 is a block diagram illustrating another example of the detector that may be used in the semiconductor device of FIG. 1.

FIG. 3 is a block diagram illustrating another example of a detector 140b that may be used as the detector 140 in the semiconductor device of FIG. 1. In the example embodiment illustrated in FIG. 3, the at least one reference voltage Vref includes two reference voltages, that is a first reference voltage Vref1 and a second reference voltage Vref2. A level of the second reference voltage Vref2 may be lower than a level of the first reference voltage Vref1 Referring to FIG. 3, the detector 140b may include a first comparator 142b, a second comparator 144b and an OR gate 146b.

The first comparator 142b may compare the resistor terminal voltage VZQ and the first reference voltage Vref1 to generate a first comparison signal CS1. The first comparison signal CS1 may have a first logic level when the level of the resistor terminal voltage VZQ is lower than a level of the first reference voltage Vref1, and may have a second logic level when the level of the resistor terminal voltage VZQ is higher than the level of the first reference voltage Vref1. The first logic level may be a logic low level and the second logic level may be a logic high level.

The second comparator 144b may compare the resistor terminal voltage VZQ and the second reference voltage Vref2 to generate a second comparison signal CS2. The second comparison signal CS2 may have the first logic level when the level of the resistor terminal voltage VZQ is higher than a level of the second reference voltage Vref2, and may have the second logic level when the level of the resistor terminal voltage VZQ is lower than the level of the second reference voltage Vref2.

The OR gate 146b may perform an OR operation on the first comparison signal CS1 and the second comparison signal CS2 to generate the detection signal DS. The detection signal DS may have the first logic level when both of the first electrical connection and the second electrical connection are normal. The detection signal DS may have the second logic level when at least one of the first electrical connection and the second electrical connection is abnormal.

In an example embodiment, the first reference voltage Vref1 may be a voltage that is between a level of the resistor terminal voltage VZQ when both the external electrical connection and the internal electrical connection are normal and a level of the resistor terminal voltage VZQ when the external electrical connection is abnormal, and the second reference voltage Vref2 is a voltage that is between the level of the resistor terminal voltage VZQ when both the external electrical connection and the internal electrical connection are normal and the level of the resistor terminal voltage VZQ when the internal electrical connection is abnormal.

In the example embodiment of FIG. 3, when both the first electrical connection and the second electrical connection are normal, the resistor terminal voltage VZQ may have a normal level. For example, when the resistor terminal ZQ is electrically connected to the external resistor RZQ and the impedance calibration unit 110, the resistor terminal ZQ may receive the resistor terminal voltage VZQ having the normal level from the impedance calibration unit 110. The normal level may correspond to about a half of the power supply voltage level VDD (i.e., 0.5×VDD).

When the first electrical connection is abnormal, the resistor terminal voltage VZQ may have a first abnormal level. For example, when the resistor terminal ZQ is electrically disconnected from the external resistor RZQ, the resistor terminal ZQ may receive the resistor terminal voltage VZQ having the first abnormal level from the impedance calibration unit 110. The first abnormal level may correspond to about the power supply voltage level VDD. When the second electrical connection is abnormal, the resistor terminal voltage VZQ may have a second abnormal level. For example, when the first node N1 of FIG. 1 is electrically disconnected from the impedance calibration unit 110, the first node N1 and the resistor terminal ZQ may receive the resistor terminal voltage VZQ having the second abnormal level from the ground voltage. When the first node N1 is electrically disconnected from the resistor terminal ZQ, the first node N1 may receive the voltage having the first abnormal level from the impedance calibration unit 110 and the resistor terminal ZQ may receive the resistor terminal voltage VZQ having the second abnormal level from the ground voltage. The second abnormal level may correspond to about the ground voltage level (i.e., 0V).

The first reference voltage Vref1 may have a level between the normal level and the first abnormal level. For example, when the normal level corresponds to about 0.5×VDD and the first abnormal level corresponds to about VDD, the first reference voltage Vref1 may have a level of about 0.7×VDD. The second reference voltage Vref2 may have a level between the normal level and the second abnormal level. For example, when the normal level corresponds to about 0.5×VDD and the second abnormal level corresponds to about 0V, the second reference voltage Vref2 may have a level of about 0.3×VDD.

Thus, when both of the first electrical connection and the second electrical connection are normal, the first and second comparison signals CS1 and CS2 may have the first logic level (i.e., logic low level) and the OR gate 146b may generate the detection signal DS having the first logic level. When at least one of the first electrical connection and the second electrical connection is abnormal, one of the first and second comparison signals CS1 and CS2 may have the second logic level (i.e., logic high level) and the OR gate 146b may generate the detection signal DS having the second logic level.

The OR gate 146b may be replaced an AND gate according to some example embodiments. In this case, the first logic level may be the logic high level and the second logic level may be the logic low level. It will be appreciated that other logic gate arrangements and/or other ways of implementing the detector 140 may be used in further embodiments.

Figure 4:
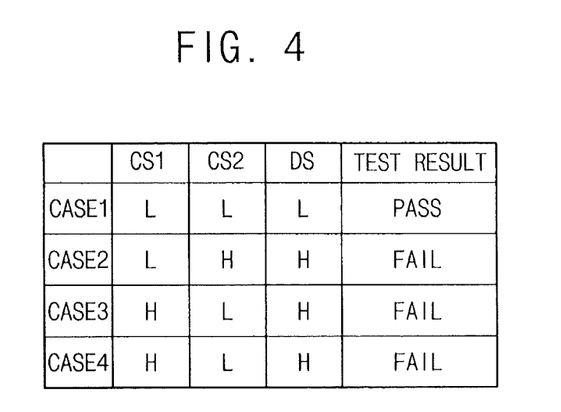
FIG. 4 is a table illustrating an example of operations of the detector of FIG. 3.

FIG. 4 is a table illustrating an example of operations of the detector of FIG. 3.

Referring to FIG. 4, CASE1 indicates that both of the first electrical connection and the second electrical connection are normal. CASE2 and CASE3 indicate that the second electrical connection is abnormal. Particularly, CASE2 indicates that the first node N1 is electrically disconnected from the impedance calibration unit 110 and CASE3 indicates that the first node N1 is electrically disconnected from the resistor terminal ZQ. CASE4 indicates that the first electrical connection is abnormal. The first reference voltage Vref1 may have a level of about 0.7×VDD and the second reference voltage Vref2 may have a level of about 0.3×VDD.

Hereinafter, the operation of the detector 140b of FIG. 3 is described with reference to FIGS. 1, 3 and 4.

In CASE1, the resistor terminal ZQ and the first node N1 receive the resistor terminal voltage VZQ having the normal level (i.e., about 0.5×VDD) from the impedance calibration unit 110, and the first and second comparison signals CS1 and CS2 have the logic low level. Thus, the detection signal DS has the logic low level and may indicate that the semiconductor device 100 is non-defective. Both the first electrical connection and the second electrical connection in the semiconductor device 100 are normal.

In CASE2, the resistor terminal ZQ and the first node N1 receive the resistor terminal voltage VZQ having the second abnormal level (i.e., about 0V) from the ground voltage, the first comparison signal CS1 has the logic low level and the second comparison signal CS2 has the logic high level. In CASE3, the resistor terminal ZQ receives the resistor terminal voltage VZQ having the second abnormal level from the ground voltage and the first node N1 receives the voltage having the first abnormal level (i.e., about VDD) from the impedance calibration unit 110. The first comparison signal CS1 has the logic high level and the second comparison signal CS2 has the logic low level. In CASE4, the resistor terminal ZQ and the first node N1 receive the resistor terminal voltage VZQ having the first abnormal level from the impedance calibration unit 110, the first comparison signal CS1 has the logic high level and the second comparison signal CS2 has the logic low level. Thus, in CASE2, CASE3 and CASE4, the detection signal DS has the logic high level and may indicate that the semiconductor device 100 is defective. The first electrical connection and/or the second electrical connection in the semiconductor device 100 are abnormal.

The detector 140b of FIG. 3 may generate the detection signal DS which indicates whether the external electrical connection is normal or abnormal, and further indicates whether the internal electrical connection is normal or abnormal. The semiconductor device 100 including the detector 140b of FIG. 3 outputs the detection signal DS through the I/O terminal DQ. Thus, the external electrical connection and/or the internal electrical connection in the semiconductor device 100 may be effectively tested.

Figure 5:
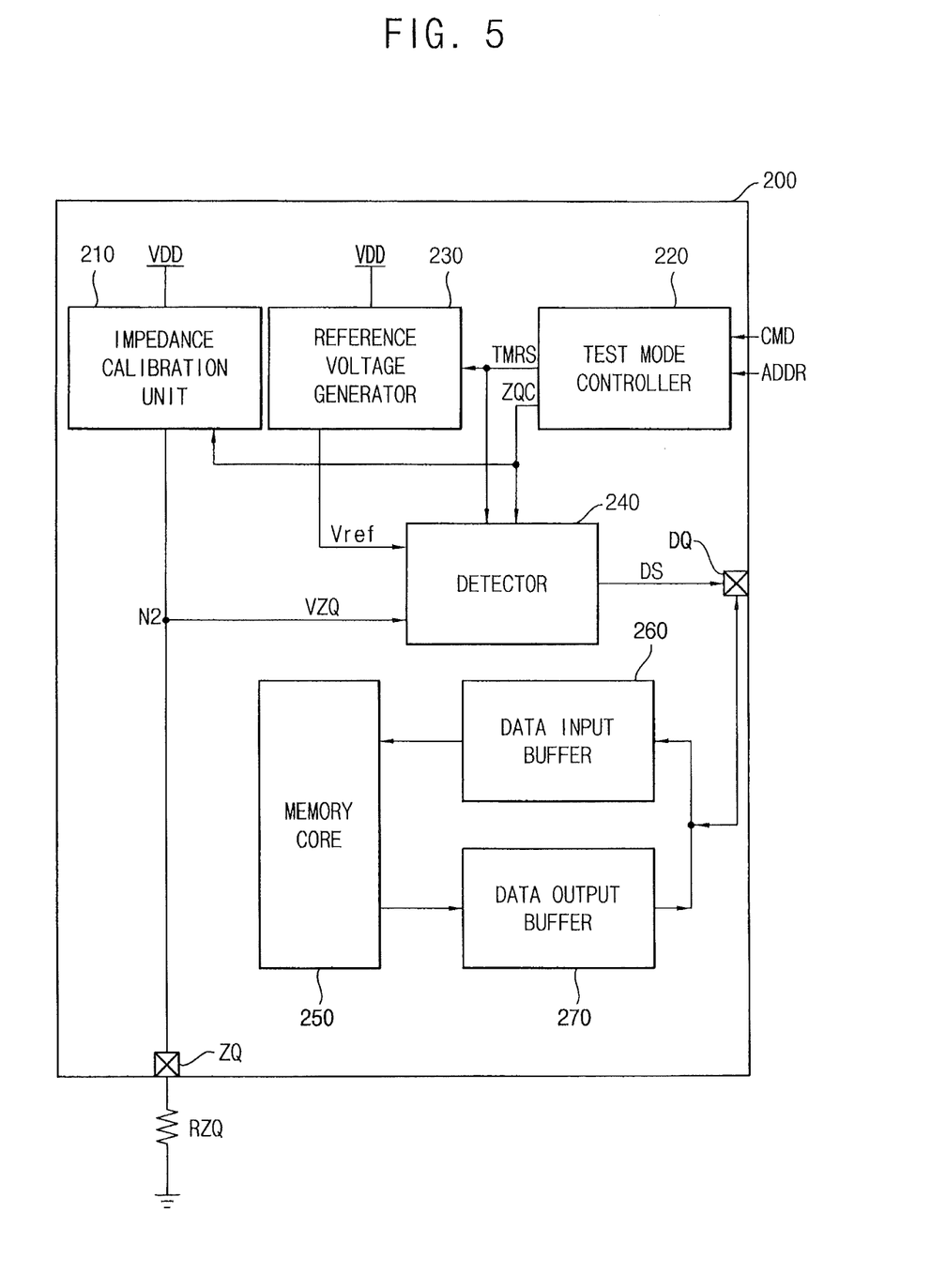
FIG. 5 is a block diagram illustrating a semiconductor memory device according to some example embodiments.

FIG. 5 is a block diagram illustrating a semiconductor memory device 200 according to some example embodiments.

Referring to FIG. 5, the semiconductor memory device 200 includes a memory core 250, a data input buffer 260, a data output buffer 270, a resistor terminal ZQ, a data input/output (I/O) terminal DQ, a reference voltage generator 230 and a detector 240. The semiconductor memory device 200 may further include an impedance calibration unit 210 and a test mode controller 220.

The memory core 250 stores write data provided from the data input buffer 260, and provides read data to the data output buffer 270 based on the stored write data. The memory core 250 may include a memory cell array having a plurality of memory cells that store data, a row decoder for selecting a word line of the memory cell array by decoding a row address, a column decoder for selecting at least one bit line of the memory cell array by decoding a column address, and a sense amplifier for generating the read data by sensing the data stored in selected memory cells.

The data input buffer 260 is connected to the data I/O terminal DQ, and receives the write data from an external memory controller (not shown) through the data I/O terminal DQ. The data output buffer 270 is connected to the data I/O terminal DQ, and transfers the read data to the external memory controller through the data I/O terminal DQ.

The resistor terminal ZQ is disposed in the semiconductor memory device 200 and is connected to an external resistor RZQ. The reference voltage generator 230 generates at least one reference voltage Vref based on a power supply voltage VDD. The impedance calibration unit 210 is connected to the resistor terminal ZQ, and calibrates an input impedance and/or an output impedance for the semiconductor memory device 200 in response to an impedance calibration signal ZQC. The test mode controller 220 generates a test mode register set (MRS) signal TMRS based on a command signal CMD and an address signal ADDR that are received from the external memory controller. The reference voltage generator 230, the impedance calibration unit 210 and the test mode controller 220 may be the reference voltage generator 130, the impedance calibration unit 110 and the test mode controller 120 of FIG. 1, respectively.

The detector 240 generates a detection signal DS based on a resistor terminal voltage VZQ and the at least one reference voltage Vref. The resistor terminal voltage VZQ is a voltage at the resistor terminal ZQ. The detector 240 may receive the resistor terminal voltage VZQ from the resistor terminal ZQ or a first node N2. The detection signal DS indicates whether a first electrical connection (i.e., external electrical connection) between the resistor terminal ZQ and the external resistor RZQ is normal or abnormal. The detection signal DS may further indicate whether a second electrical connection (i.e., internal electrical connection) between the resistor terminal ZQ and the impedance calibration unit 210 is normal or abnormal.

The detector 240 may be, for example, one of the detector 140a of FIG. 2 and the detector 140b of FIG. 3. The data I/O terminal DQ may be connected to the detector 240. The semiconductor memory device 200 may output the detection signal DS through the data I/O terminal DQ. The semiconductor memory device 200 may be determined as defective or non-defective based on a logic level of the detection signal DS. In an example embodiment, the detector 240 may output the detection signal DS in response to an impedance calibration signal ZQC.

The semiconductor memory device 200 may be a Double Data Rate 3 (DDR3) Synchronous Dynamic Random Access Memory (SDRAM). The DDR3 SDRAM includes the resistor terminal ZQ connected to the external resistor RZQ having a resistance of about 240Ω±1%. When the impedance calibration command ZQC is enabled, the impedance calibration unit 210 calibrates the input impedance and/or the output impedance for the DDR3 SDRAM (e.g., an impedance of an output driver and an impedance of an on-die termination circuit). Thus, the DDR3 SDRAM may maintain the input impedance and/or the output impedance, regardless of process, voltage and temperature (PVT) conditions.

However, in a conventional DDR3 SDRAM, an external resistor for impedance calibration is not connected to the data I/O terminal, and an additional I/O terminal is required to test an electrical connection of the external resistor. In the semiconductor memory device 200 according to some example embodiments, the detector 240 generates the detection signal DS which indicates whether the external electrical connection and/or the internal electrical connection are normal or abnormal. The semiconductor memory device 200 outputs the detection signal DS through the data I/O terminal DQ. In addition, the semiconductor memory device 200 may perform the impedance calibrating operation and the outputting the detection signal DS simultaneously in response to the impedance calibration signal ZQC. Thus, the external electrical connection and/or the internal electrical connection in the semiconductor memory device 200 may be effectively tested, without an additional I/O terminal.

Figure 6A:
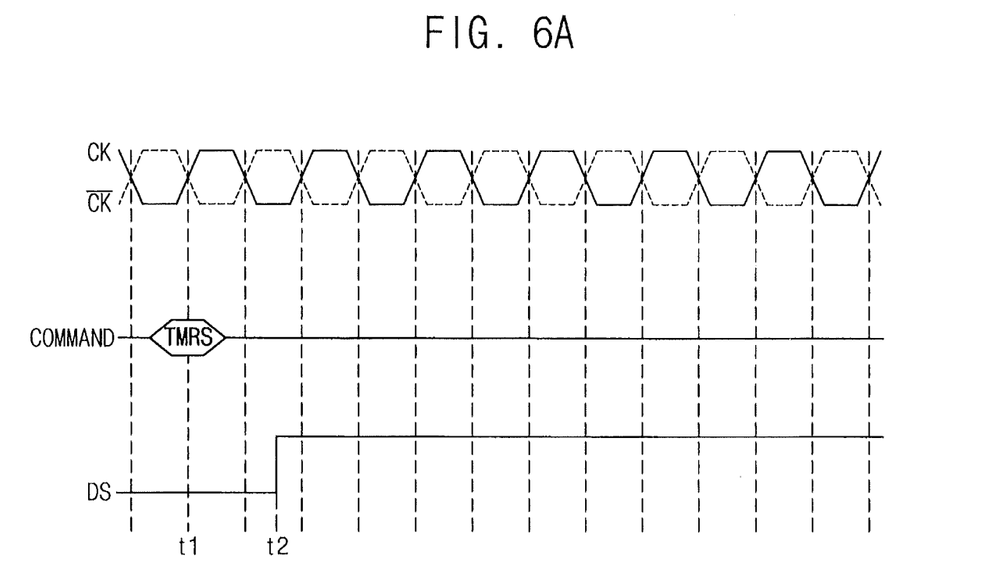
FIGS. 6A, 6B and 6C are timing diagrams illustrating examples of operations of the semiconductor memory device of FIG. 5.
Figure 6B:
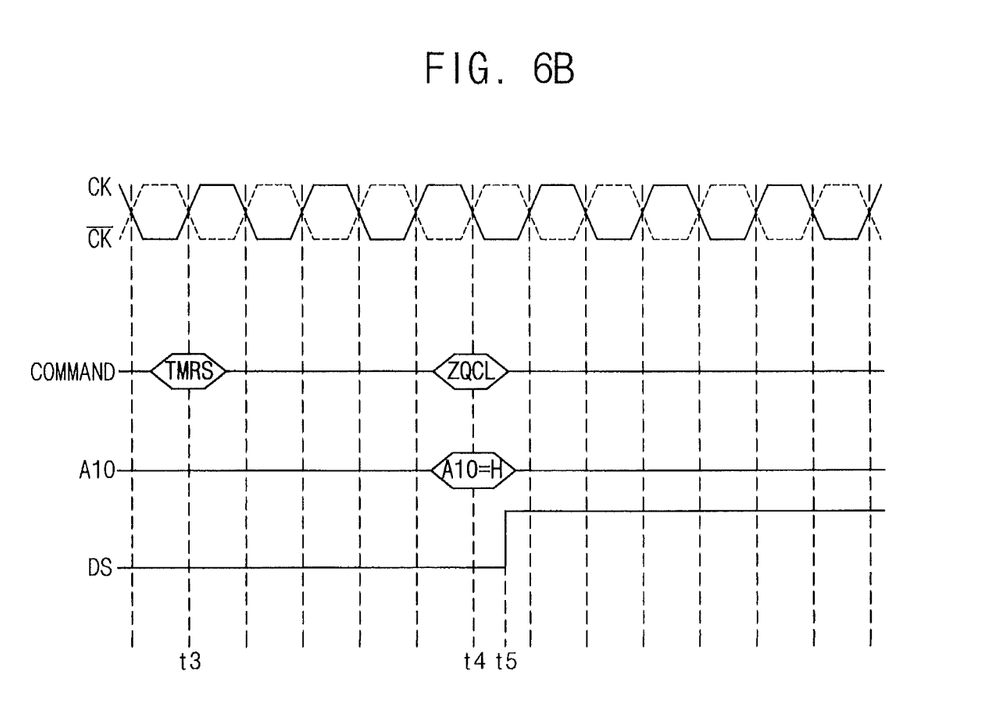
Figure 6C:
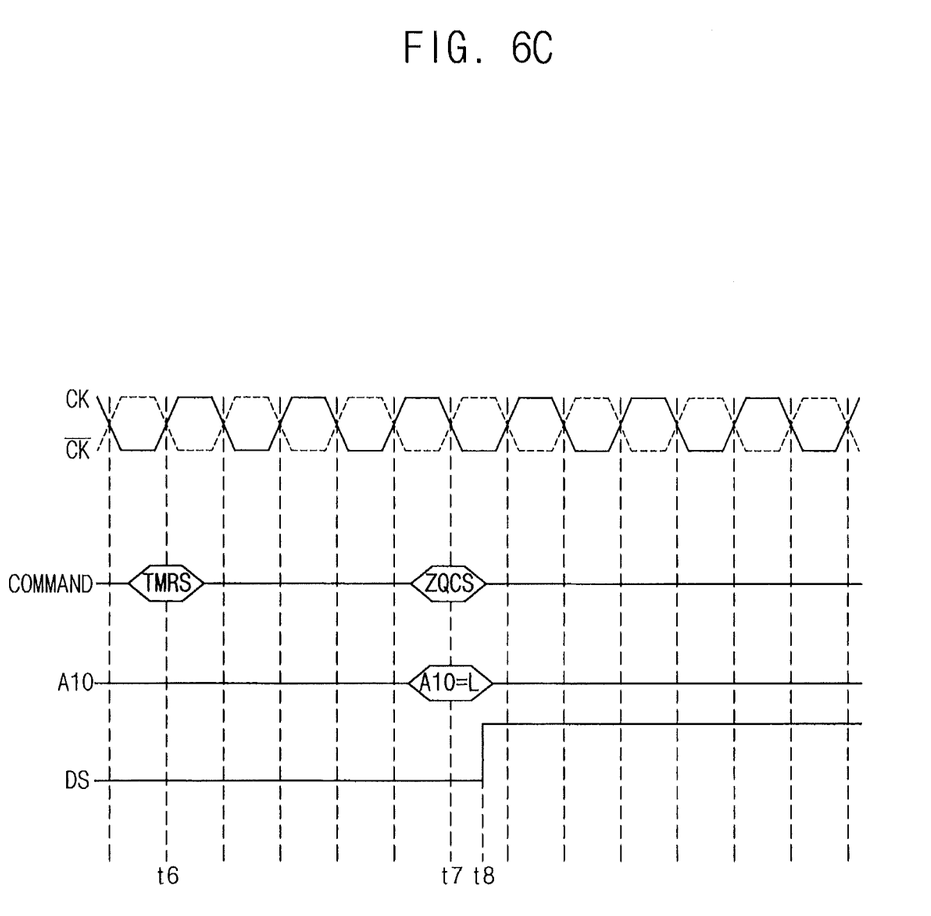

FIGS. 6A, 6B and 6C are timing diagrams illustrating examples of operations of the semiconductor memory device of FIG. 5. In FIGS. 6A, 6B and 6C, COMMAND indicates an operating state of the semiconductor memory device 200.

Referring to FIGS. 5 and 6A, at time t1, when the command signal CMD and the address signal ADDR have a predetermined combination, the test MRS signal TMRS is enabled. For example, in the predetermined combination, an inverted chip select signal /CS and an inverted write enable signal /WE may have a logic low level and an inverted row address strobe signal /RAS and an inverted column address strobe signal /CAS may have a logic high level. The semiconductor memory device 200 operates in a test mode, and generates the detection signal DS based on the at least one reference signal Vref and the resistor terminal voltage VZQ. At time t2, the semiconductor memory device 200 outputs the detection signal DS through the data I/O terminal DQ. In an example embodiment illustrated in FIG. 6A, the semiconductor memory device 200 outputs the detection signal DS without any additional operations.

Referring to FIGS. 5 and 6B, at time t3, when the command signal CMD and the address signal ADDR have the predetermined combination, the test MRS signal TMRS is enabled and the semiconductor memory device 200 operates in the test mode. The semiconductor memory device 200 generates the detection signal DS based on the at least one reference signal Vref and the resistor terminal voltage VZQ, but do not output the detection signal DS. At time t4, when an address bit A10 included in the address signal ADDR has the logic high level, a first impedance calibration signal ZQCL is enabled and the semiconductor memory device 200 performs a first impedance calibrating operation (e.g., long ZQ calibration in DDR3 SDRAM). At time t5, the semiconductor memory device 200 outputs the detection signal DS through the data I/O terminal DQ in response to the first impedance calibration signal ZQCL. As shown in FIG. 6B, the semiconductor memory device 200 outputs the detection signal DS during the first impedance calibrating operation.

Referring to FIGS. 5 and 6C, at time t6, when the command signal CMD and the address signal ADDR have the predetermined combination, the test MRS signal TMRS is enabled and the semiconductor memory device 200 operates in the test mode. The semiconductor memory device 200 generates the detection signal DS based on the at least one reference signal Vref and the resistor terminal voltage VZQ, but does not output the detection signal DS. At time t7, when an address bit A10 has the logic low level, a second impedance calibration signal ZQCS is enabled and the semiconductor memory device 200 performs a second impedance calibrating operation (e.g., short ZQ calibration in DDR3 SDRAM). At time t8, the semiconductor memory device 200 outputs the detection signal DS through the data I/O terminal DQ in response to the second impedance calibration signal ZQCS. As shown in FIG. 6C, the semiconductor memory device 200 outputs the detection signal DS during the second impedance calibrating operation.

In a conventional semiconductor memory device, the data I/O terminal DQ is floated during the impedance calibrating operations, and the conventional semiconductor memory device does not output data or any signal through the data I/O terminal DQ during the impedance calibrating operations. In the semiconductor memory device 200 according to some example embodiments, the detector 240 generates the detection signal DS that indicates whether the semiconductor memory device 200 is defective or non-defective, and the semiconductor memory device 200 outputs the detection signal DS through the data I/O terminal DQ in response to the impedance calibration signals ZQCL and ZQCS. The semiconductor memory device 200 may simultaneously perform the impedance calibrating operation and the testing operation, and thus the external electrical connection and/or the internal electrical connection in the semiconductor memory device 200 may be effectively tested.

Figure 7:
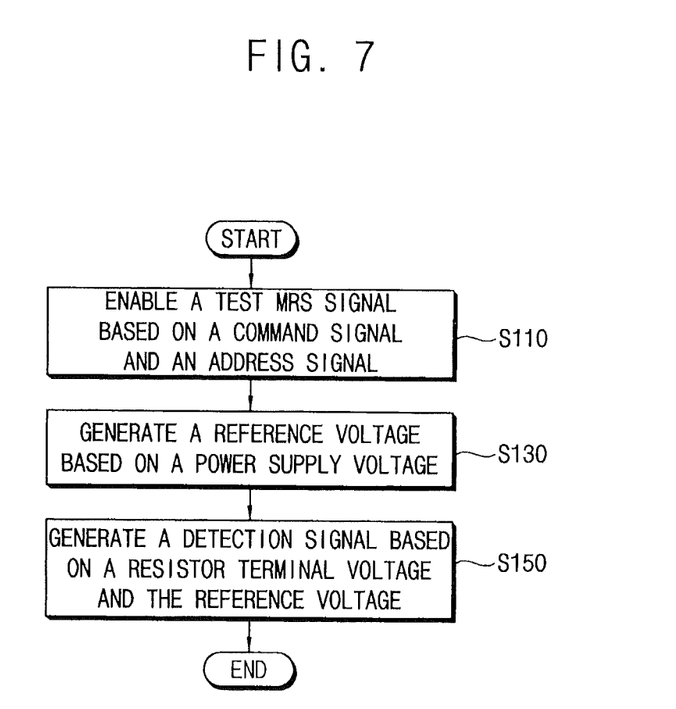
FIG. 7 is a flow chart illustrating a method of testing a semiconductor device according to some example embodiments.

FIG. 7 is a flow chart illustrating testing a semiconductor device according to some example embodiments.

Referring to FIG. 7, the semiconductor device generates a test mode register set (MRS) signal based on a command signal and an address signal. The semiconductor device may include a resistor terminal connected to an external resistor and an input/output (I/O) terminal. The semiconductor device may further include an impedance calibration unit that is connected to the resistor terminal, and calibrates an input impedance and/or an output impedance for the semiconductor device in response to an impedance calibration signal.

The test MRS signal is enabled based on the command signal and the address signal (S110). For example, when the command signal and the address signal have a predetermined combination, the test MRS signal may be enabled. When the test MRS signal is disabled, the semiconductor device may operate in a normal mode and when the test MRS signal is enabled, the semiconductor device may operate in a test mode.

In the test mode, the semiconductor device generates at least one reference voltage based on a power supply voltage (S130). The semiconductor device generates a detection signal based on a resistor terminal voltage and the at least one reference voltage (S150). The resistor terminal voltage is a voltage at the resistor terminal and the detection signal indicates whether a first electrical connection (i.e., external electrical connection) between the resistor terminal and the external resistor is normal or abnormal. The detection signal may further indicate whether a second electrical connection (i.e., internal electrical connection) between the resistor terminal and the impedance calibration unit is normal or abnormal.

Figure 8A:
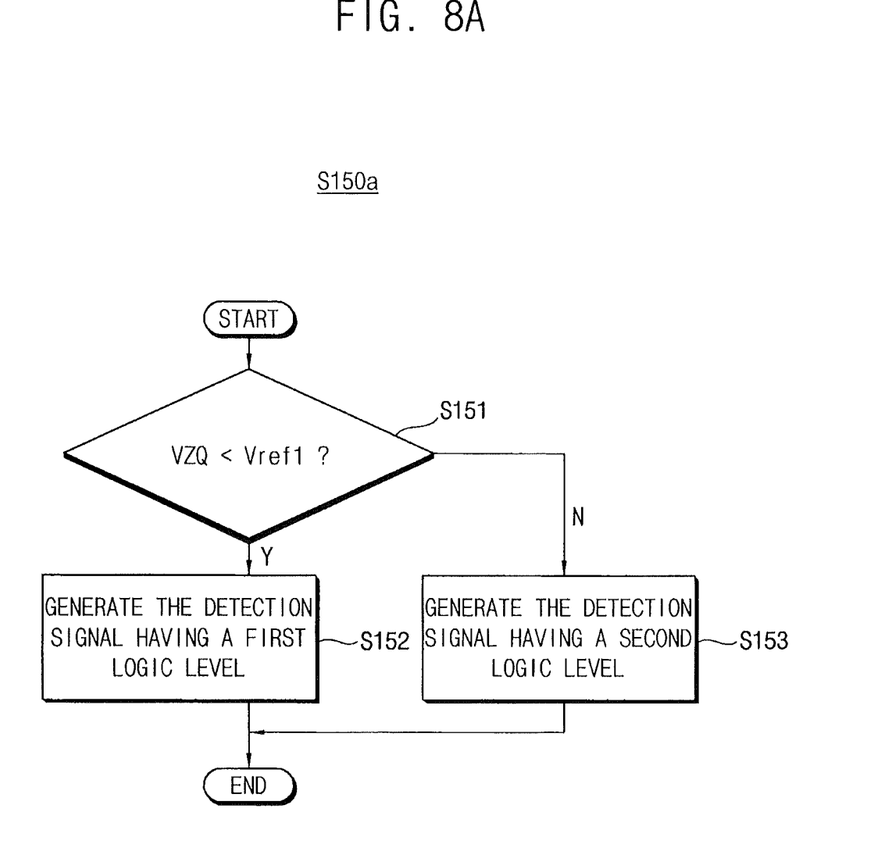
FIG. 8A is a flow chart illustrating an example method of generating a detection signal in block S150 of FIG. 7.

FIG. 8A is a flow chart illustrating an example of generating a detection signal of FIG. 7. In FIG. 8A, the at least one reference voltage may include a first reference voltage Vref1.

Referring to FIG. 8A, the semiconductor device may compare the resistor terminal voltage VZQ with the first reference voltage Vref1 and may determine whether the resistor terminal voltage VZQ is larger than or smaller than the first reference voltage Vref1 (S151). When the resistor terminal voltage VZQ is smaller than the first reference voltage Vref1, the semiconductor device may generate the detection signal having a first logic level (S152). If the detection signal has the first logic level, the semiconductor device may be determined as non-defective. When the resistor terminal voltage VZQ is larger than the first reference voltage Vref1, the semiconductor device may generate the detection signal having a second logic level (S153). If the detection signal has the second logic level, the semiconductor device may be determined as defective. The semiconductor device may output the detection signal through the I/O terminal in response to the impedance calibration signal.

For example, the first reference voltage Vref1 may have a level of about $0.7 \times VDD$. When the first electrical connection is normal, the resistor terminal voltage VZQ may have a level of about $0.5 \times VDD$. When the first electrical connection is abnormal, the resistor terminal voltage VZQ may have a level of about VDD. Thus, the semiconductor device may be determined as defective or non-defective based on the first reference voltage Vref1 and the resistor terminal voltage VZQ.

Figure 8B:
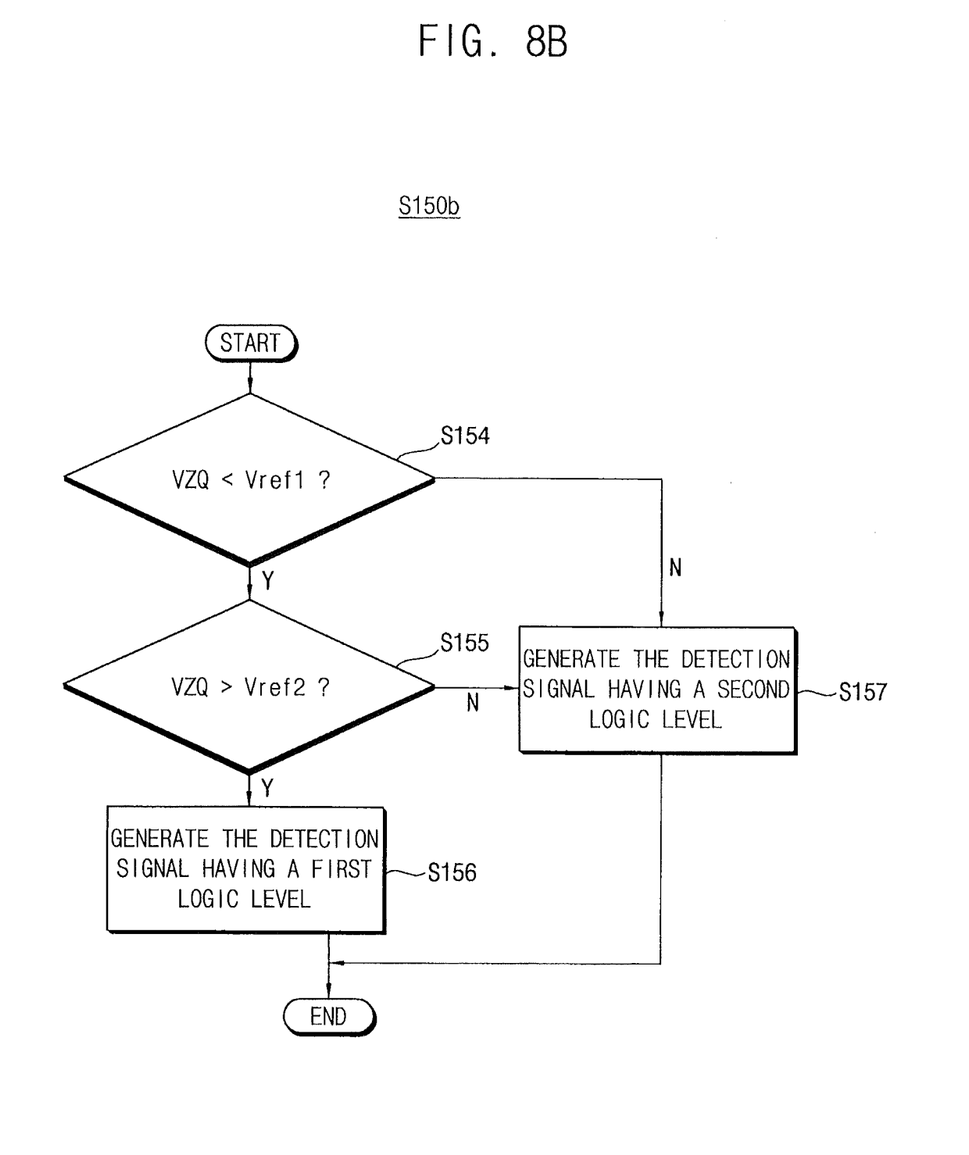
FIG. 8B is a flow chart illustrating another example method of generating the detection signal in block S150 of FIG. 7.

FIG. 8B is a flow chart illustrating another example of generating the detection signal of FIG. 7. In FIG. 8B, the at least one reference voltage may include a first reference voltage Vref1 and a second reference voltage Vref2.

Referring to FIG. 8B, the semiconductor device may compare the resistor terminal voltage VZQ with the first reference voltage Vref1 and may determine whether the resistor terminal voltage VZQ is larger or smaller than the first reference voltage Vref1 (S154). When the resistor terminal voltage VZQ is smaller than the first reference voltage Vref1, the semiconductor device may compare the resistor terminal voltage VZQ with the second reference voltage Vref2 and may determine whether the resistor terminal voltage VZQ is larger or smaller than the second reference voltage Vref2 (S155). When the resistor terminal voltage VZQ is smaller than the first reference voltage Vref1 and the resistor terminal voltage VZQ is larger than the second reference voltage Vref2, the semiconductor device may generate the detection signal having a first logic level (S156). If the detection signal has the first logic level, the semiconductor device may be determined as non-defective. When the resistor terminal voltage VZQ is larger than the first reference voltage Vref1 or when the resistor terminal voltage VZQ is smaller than the second reference voltage Vref2, the semiconductor device may generate the detection signal having a second logic level (S157). If the detection signal has the second logic level, the semiconductor device may be determined as defective.

For example, the first reference voltage Vref1 may have a level of about 0.7×VDD and the second reference voltage Vref2 may have a level of about 0.3×VDD. When both of the first electrical connection and the second electrical connection are normal, the resistor terminal voltage VZQ may have a level of about 0.5×VDD. When the first electrical connection is abnormal, the resistor terminal voltage VZQ may have a level of about VDD. When the second electrical connection is abnormal, the resistor terminal voltage VZQ may have a level of about 0V. Thus, the semiconductor device may be determined as defective or non-defective based on the reference voltages Vref1 and Vref2 and the resistor terminal voltage VZQ.

Figure 9:
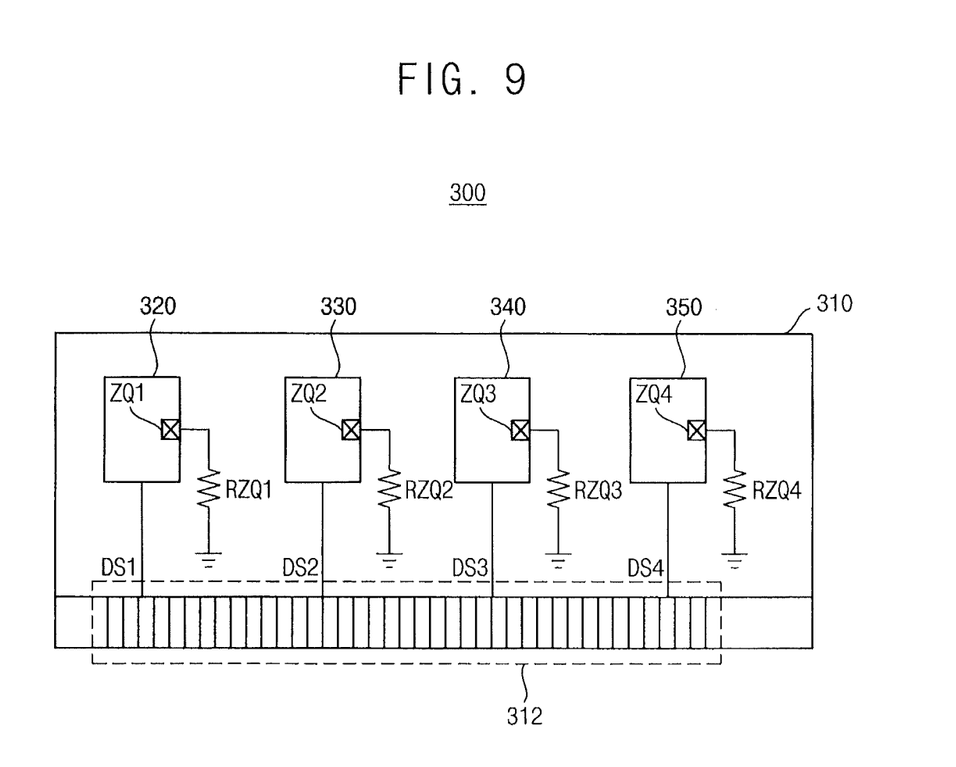
FIG. 9 is a block diagram illustrating a semiconductor module according to some example embodiments.

FIG. 9 is a block diagram illustrating a semiconductor module according to some example embodiments.

Referring to FIG. 9, the semiconductor module 300 includes a module board 310, a plurality of semiconductor devices 320, 330, 340 and 350, and a plurality of resistors RZQ1, RZQ2, RZQ3 and RZQ4.

The plurality of semiconductor devices 320, 330, 340 and 350 are mounted on the module board 310. Each of the semiconductor devices 320, 330, 340 and 350 may be implemented with a semiconductor chip. The semiconductor devices 320, 330, 340 and 350 include the respective resistor terminals ZQ1, ZQ2, ZQ3 and ZQ4, and output the respective detection signals DS1, DS2, DS3 and DS4. The resistor terminals ZQ1, ZQ2, ZQ3 and ZQ4 are connected to the resistors RZQ1, RZQ2, RZQ3 and RZQ4, respectively, and each of the detection signals DS1, DS2, DS3 and DS4 indicates whether an electrical connection between the respective semiconductor devices 320, 330, 340 and 350 and their respective resistors RZQ1, RZQ2, RZQ3 and RZQ4 is normal or abnormal. Each of input/output (I/O) terminals (not shown) included in the semiconductor devices 320, 330, 340 and 350 is connected to an I/O tab 312 included in the module board 310. The semiconductor devices 320, 330, 340 and 350 may receive a command signal and an address signal from an external device such as a test device, and may output data and the respective detection signals DS1, DS2, DS3 and DS4 to the external device through the I/O terminals and the I/O tab 312.

Each of the semiconductor devices 320, 330, 340 and 350 may be one of the semiconductor device 100 of FIG. 1 or the semiconductor memory device 200 of FIG. 5. For example, in some embodiments the first semiconductor device 320 may include a first resistor terminal ZQ1 connected to a first resistor RZQ1, a first reference voltage generator for generating at least one first reference voltage based on a power supply voltage, and a detector for generating a first detection signal DS1 based on a first resistor terminal voltage and the at least one first reference voltage. The first resistor terminal voltage is a voltage at the first resistor terminal ZQ1, and the first detection signal DS1 indicates whether a first external electrical connection between the first resistor terminal ZQ1 and the first resistor RZQ1 is normal or abnormal.

The plurality of resistors RZQ1, RZQ2, RZQ3 and RZQ4 are mounted on the module board 310. The resistors RZQ1, RZQ2, RZQ3 and RZQ4 are connected between the resistor terminals ZQ1, ZQ2, ZQ3 and ZQ4, respectively, and a ground voltage. For example, a first resistor RZQ1 may be connected between the first resistor terminal ZQ1 and the ground voltage.

Although four semiconductor devices 320, 330, 340 and 350 are illustrated in FIG. 9 for convenience of illustration, the number of semiconductor devices included in the semiconductor module 300 is not limited thereto. For example, a high density semiconductor memory module for server may include 72 semiconductor devices (e.g., DDR3 SDRAM).

Figure 10:
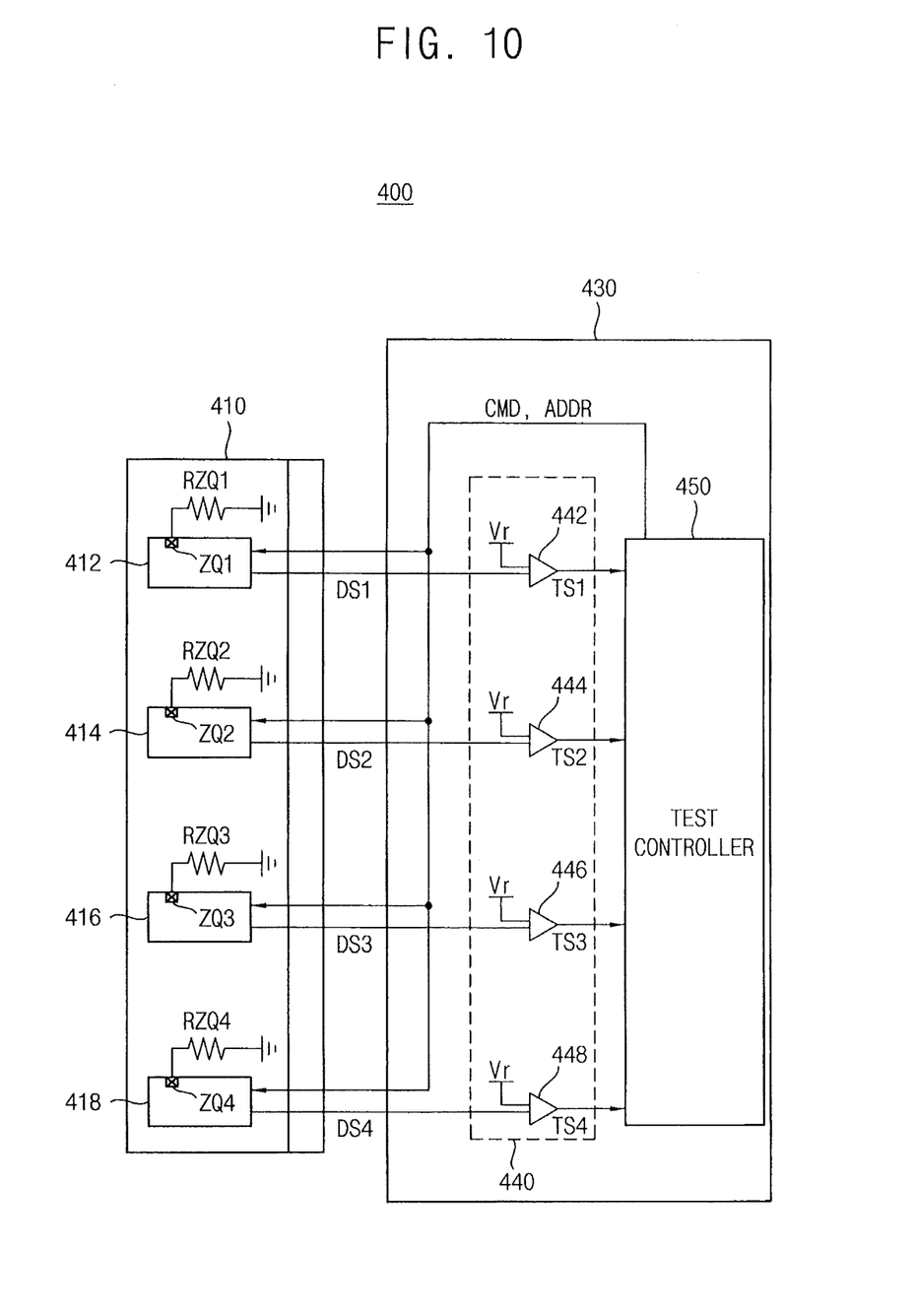
FIG. 10 is a block diagram illustrating a test system according to some example embodiments.

FIG. 10 is a block diagram illustrating a test system according to some example embodiments.

Referring to FIG. 10, the test system 400 includes a semiconductor module 410 and a test device 430.

The semiconductor module 410 includes a plurality of semiconductor devices 412, 414, 416 and 418 and a plurality of resistors RZQ1, RZQ2, RZQ3 and RZQ4 on a module board. Each of the semiconductor devices 412, 414, 416 and 418 includes one of resistor terminals ZQ1, ZQ2, ZQ3 and ZQ4, receives a command signal CMD and an address signal ADDR from the test device 430 and outputs one of detection signals DS1, DS2, DS3 and DS4. Each of the resistors RZQ1, RZQ2, RZQ3 and RZQ4 is connected to one of resistor terminals ZQ1, ZQ2, ZQ3 and ZQ4. The semiconductor module 410 may be the semiconductor module 300 of FIG. 9. Each of the semiconductor devices 412, 414, 416 and 418 may be the semiconductor device 100 of FIG. 1 or the semiconductor memory device 200 of FIG. 5.

The test device 430 tests the semiconductor module 410 to determine whether electrical connections between the plurality of semiconductor devices 412, 414, 416 and 418 and the plurality of resistors RZQ1, RZQ2, RZQ3 and RZQ4 are normal or abnormal. The test device 430 may include a receiver 440 and a test controller 450.

The receiver 440 may receive the detection signals DS1, DS2, DS3 and DS4 from the semiconductor module 410 and provide test signals TS1, TS2, TS3 and TS4 to the test controller 450. The receiver 440 may include a plurality of comparators 442, 444, 446 and 448. Each of the comparators 442, 444, 446 and 448 may compare a reference signal Vr with a respective one of the detection signals DS1, DS2, DS3 and DS4 to generate a respective one of the test signals TS1, TS2, TS3 and TS4. For example, a first comparator 442 may compare the reference signal Vr with a first detection signal DS1 to generate a first test signal TS1. Each of the test signals TS1, TS2, TS3 and TS4 may have a first logic level when the first electrical connection is normal, and may have a second logic level when the first electrical connection is abnormal.

The test controller 450 may generate the command signal CMD and the address signal ADDR controlling the semiconductor module 410. Each of the semiconductor devices 412, 414, 416 and 418 may generate a respective one of detection signals DS1, DS2, DS3 and DS4 based on the command signal CMD and the address signal ADDR. The test controller 450 may determine whether each of the semiconductor devices 412, 414, 416 and 418 is defective or non-defective.

In the test system 400 according to some example embodiments, the semiconductor module 410 simultaneously outputs the plurality of detection signals DS1, DS2, DS3 and DS4 which indicate whether each of the semiconductor devices 412, 414, 416 and 418 is defective or non-defective. The test device 430 simultaneously determines whether the electrical connections between the semiconductor devices 412, 414, 416 and 418 and the respective resistors RZQ1, RZQ2, RZQ3 and RZQ4 are normal or abnormal. Thus, the test system 400 may effectively and rapidly test the semiconductor devices 412, 414, 416 and 418 included in the semiconductor module 410.

As described above, the semiconductor device according to some example embodiments may be used in semiconductor modules and test systems for effectively testing the semiconductor device.

While the example embodiments and their advantages have been described in detail, it should be understood that various changes, substitutions and alterations may be made herein without departing from the scope of the inventive concept.

What is claimed is:

1. A semiconductor device comprising:
    a resistor terminal connected to an external resistor;
    a reference voltage generator configured to generate at least one reference voltage;
    a detector configured to generate a detection signal based at least in part on a resistor terminal voltage and the at least one reference voltage, the detection signal indicating a state of an electrical connection to the resistor terminal, the resistor terminal voltage being a voltage at the resistor terminal; and
    an impedance calibration unit connected to the resistor terminal and configured to calibrate an input impedance and/or an output impedance for the semiconductor device in response to an impedance calibration signal,
    wherein the electrical connection is an external electrical connection between the resistor terminal and the external resistor,
    wherein the detection signal indicates whether the state of the external electrical connection between the resistor terminal and the external resistor is normal or abnormal,
    wherein the at least one reference voltage is based on a power supply voltage,
    wherein the semiconductor device is configured to simultaneously output the detection signal and calibrate the input impedance and/or output impedance for the semiconductor device,
    wherein the detection signal further indicates whether an internal electrical connection between the resistor terminal and the impedance calibration unit is normal or abnormal, and
    wherein the detector comprises:
        a first comparator that is configured to compare the resistor terminal voltage and a first reference voltage of the at least one reference voltage to generate a first comparison signal;
        a second comparator that is configured to compare the resistor terminal voltage and a second reference voltage of the at least one reference voltage to generate a second comparison signal, a level of the second reference voltage being lower than a level of the first reference voltage; and
        an OR gate configured to perform an OR operation on the first comparison signal and the second comparison signal to generate the detection signal.

2. The semiconductor device of claim 1, further comprising:
    at least one input/output (I/O) terminal connected to the detector, wherein the semiconductor device is configured to output the detection signal through the at least one I/O input/output terminal.

3. The semiconductor device of claim 1, wherein the at least one reference voltage comprises a first reference voltage, and wherein the detector comprises:
    a comparator that is configured to compare the resistor terminal voltage and the first reference voltage to generate the detection signal.

4. The semiconductor device of claim 1, wherein the first reference voltage is a voltage that is between a level of the resistor terminal voltage when both the external electrical connection and the internal electrical connection are normal and a level of the resistor terminal voltage when the external electrical connection is abnormal, and the second reference voltage is a voltage that is between the level of the resistor terminal voltage when both the external electrical connection and the internal electrical connection are normal and the level of the resistor terminal voltage when the internal electrical connection is abnormal.

5. The semiconductor device of claim 1, wherein the semiconductor device outputs the detection signal in response to the impedance calibration signal.

6. The semiconductor device of claim 1, further comprising:
    a test mode controller configured to generate a test mode register set (MRS) signal based on a command signal and an address signal,
    wherein the reference voltage generator generates the at least one reference voltage and the detector generates the detection signal, when the test MRS signal is enabled.

* * * * *